United States Patent
Badillo et al.

(10) Patent No.: US 9,859,879 B2
(45) Date of Patent: Jan. 2, 2018

(54) METHOD AND APPARATUS TO CLIP INCOMING SIGNALS IN OPPOSING DIRECTIONS WHEN IN AN OFF STATE

(71) Applicant: Knowles Electronics, LLC, Itasca, IL (US)

(72) Inventors: Dean A. Badillo, Schaumburg, IL (US); Michael Jennings, Plano, TX (US); Craig Stein, Naperville, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 14/852,054

(22) Filed: Sep. 11, 2015

(65) Prior Publication Data

US 2017/0077914 A1    Mar. 16, 2017

(51) Int. Cl.
*H03K 5/08* (2006.01)
(52) U.S. Cl.
CPC .................................. *H03K 5/084* (2013.01)
(58) Field of Classification Search
CPC .. H03K 5/08; H03H 17/0219; H03H 21/0067; H03H 9/02086; H03H 9/02433; H03H 9/02818
USPC ................................ 327/309, 310, 317, 321
See application file for complete search history.

(56) References Cited

U.S. PATENT DOCUMENTS

| | | | |
|---|---|---|---|
| 1,871,739 A | 8/1932 | Ringel | |
| 2,143,097 A | 1/1939 | Warneke | |
| 2,632,830 A | 3/1953 | Aust et al. | |
| 2,994,016 A | 7/1961 | Tibbetts et al. | |
| 3,111,563 A | 11/1963 | Carlson | |
| 3,163,723 A | 12/1964 | Tibbetts | |
| 3,172,022 A | 3/1965 | Tibbetts | |
| 3,177,412 A | 4/1965 | Carlson | |
| 3,182,384 A | 5/1965 | Carlson et al. | |
| 3,347,991 A | 10/1967 | Carlson | |
| 3,432,622 A | 3/1969 | Sebesta et al. | |
| 3,445,802 A | 5/1969 | Spaude | |
| 3,531,745 A | 9/1970 | Tibbetts | |
| 3,533,043 A | 10/1970 | Spaude | |
| 3,617,653 A | 11/1971 | Tibbetts et al. | |

(Continued)

FOREIGN PATENT DOCUMENTS

| | | |
|---|---|---|
| CN | 204118900 | 1/2015 |
| CN | 204190936 | 3/2015 |

(Continued)

OTHER PUBLICATIONS

Razavi B., Design of Analog CMOS Integrated Circuits, McGraw-Hill Education 1st edition, Aug. 15, 2000, 8 pages.

(Continued)

*Primary Examiner* — John Poos
(74) *Attorney, Agent, or Firm* — Faegre Baker Daniels LLP

(57) ABSTRACT

A MOSFET active-disable switch is configured to clip an incoming signal in opposing directions when in an off state. By one approach the clipping is symmetrical and accordingly the switch clips both positive and negative peaks of the incoming signal. In many application settings it is useful for the clipping to serve to decrease a predetermined kind of resultant distortion such as even order distortion. In the on state this MOSFET active-disable switch is configured to not clip the incoming signal in opposing directions.

16 Claims, 2 Drawing Sheets

(56) References Cited

U.S. PATENT DOCUMENTS

| | | |
|---|---|---|
| 3,626,171 A | 12/1971 | Abramowitz et al. |
| 3,835,263 A | 9/1974 | Killion |
| 3,836,732 A | 9/1974 | Johanson et al. |
| 3,935,398 A | 1/1976 | Carlson et al. |
| 3,970,986 A | 7/1976 | Seyler et al. |
| 3,975,599 A | 8/1976 | Johanson |
| 4,142,072 A | 2/1979 | Berland |
| 4,272,654 A | 6/1981 | Carlson |
| 4,385,219 A | 5/1983 | Finlayson |
| 4,410,769 A | 10/1983 | Tibbetts |
| 4,467,145 A | 8/1984 | Borstel |
| 4,518,831 A | 5/1985 | Stanley et al. |
| 4,550,227 A | 10/1985 | Topholm |
| 4,592,087 A | 5/1986 | Killion |
| 4,689,819 A | 8/1987 | Killion |
| 4,700,211 A | 10/1987 | Popovic et al. |
| 4,743,723 A | 5/1988 | Seabeck |
| 4,758,699 A | 7/1988 | Ciriscioli |
| 4,803,458 A | 2/1989 | Trine et al. |
| 4,871,890 A | 10/1989 | Herrera |
| 4,947,439 A | 8/1990 | Buettner |
| 4,961,230 A | 10/1990 | Rising |
| 5,004,880 A | 4/1991 | Koutaka |
| 5,066,841 A | 11/1991 | Zoller et al. |
| 5,083,095 A | 1/1992 | Madaffari |
| 5,193,116 A | 3/1993 | Mostardo |
| 5,259,035 A | 11/1993 | Peters et al. |
| 5,297,075 A | 3/1994 | Peters |
| 5,337,011 A | 8/1994 | French |
| 5,353,244 A | 10/1994 | Peters |
| 5,412,736 A | 5/1995 | Keliiliki |
| 5,446,413 A | 8/1995 | Loeppert |
| 5,524,056 A | 6/1996 | Killion et al. |
| 5,559,892 A | 9/1996 | Boor |
| 5,579,398 A | 11/1996 | Ewens |
| 5,588,064 A | 12/1996 | McSwiggen et al. |
| 5,592,079 A | 1/1997 | Scheel |
| 5,647,013 A | 7/1997 | Salvage et al. |
| 5,684,425 A * | 11/1997 | Nicollini ............ H03K 17/6872 327/310 |
| 5,692,060 A | 11/1997 | Wickstrom |
| 5,740,261 A | 4/1998 | Loeppert et al. |
| 5,745,025 A | 4/1998 | Ruess |
| 5,757,933 A | 5/1998 | Prevers et al. |
| 5,773,774 A | 6/1998 | Ramamurthy |
| 5,799,095 A | 8/1998 | Hanright |
| 5,803,242 A | 9/1998 | Takano et al. |
| 5,835,608 A | 11/1998 | Warnaka et al. |
| 5,861,779 A | 1/1999 | Loeppert |
| 5,990,423 A | 11/1999 | Ashpes |
| 6,028,502 A | 2/2000 | McSwiggen |
| 6,041,131 A | 3/2000 | Kirchhoefer et al. |
| 6,075,869 A | 6/2000 | Killion et al. |
| 6,088,465 A | 7/2000 | Hanright |
| 6,091,831 A | 7/2000 | Cho |
| 6,134,334 A | 10/2000 | Killion et al. |
| 6,151,399 A | 11/2000 | Killion et al. |
| 6,307,944 B1 | 10/2001 | Garratt |
| 6,441,332 B1 | 8/2002 | Crawford et al. |
| 6,630,639 B2 | 10/2003 | McSwiggen |
| 6,636,645 B1 | 10/2003 | Yu et al. |
| 6,861,604 B2 | 3/2005 | McSwiggen |
| 6,876,749 B1 | 4/2005 | Killion et al. |
| 6,972,386 B1 | 12/2005 | McSwiggen |
| 6,985,598 B1 | 1/2006 | Joschika |
| 7,092,538 B2 | 8/2006 | Potter |
| 7,136,497 B2 | 11/2006 | McSwiggen |
| 7,162,381 B2 | 1/2007 | Boor |
| 7,221,766 B2 | 5/2007 | Boor |
| 7,236,609 B1 | 6/2007 | Tsangaris et al. |
| 7,317,997 B2 | 1/2008 | Boor |
| 7,352,876 B2 | 4/2008 | Boor |
| 7,688,987 B2 | 3/2010 | Boor |
| 7,706,559 B2 | 4/2010 | Collins |
| 8,073,153 B2 | 12/2011 | Loeppert |
| 8,123,547 B2 | 2/2012 | Miller |
| 8,604,880 B2 | 12/2013 | Boor |
| 8,682,015 B2 | 3/2014 | Miller |
| 8,687,823 B2 | 4/2014 | Loeppert |
| 8,798,304 B2 | 8/2014 | Miller |
| 8,890,615 B2 | 11/2014 | Boor |
| 2001/0036287 A1 | 11/2001 | Beard |
| 2002/0001391 A1 | 1/2002 | Darbut |
| 2002/0039428 A1 | 4/2002 | Svajda et al. |
| 2003/0059073 A1 | 3/2003 | Bren et al. |
| 2003/0059076 A1 | 3/2003 | Martin |
| 2003/0062924 A1 * | 4/2003 | Wyland ............ H03K 19/01714 326/88 |
| 2003/0128856 A1 | 7/2003 | Boor |
| 2004/0052392 A1 | 3/2004 | Sacha et al. |
| 2004/0179702 A1 | 9/2004 | Boor |
| 2004/0179703 A1 | 9/2004 | Boor |
| 2004/0179707 A1 | 9/2004 | Lundh |
| 2004/0251948 A1 * | 12/2004 | Lee ...................... H03H 19/008 327/308 |
| 2005/0078841 A1 | 4/2005 | Boor |
| 2005/0213787 A1 | 9/2005 | Collins |
| 2006/0067544 A1 | 3/2006 | Moraghan |
| 2007/0217628 A1 | 9/2007 | Boor |
| 2007/0223735 A1 | 9/2007 | LoPresti |
| 2010/0098284 A1 | 4/2010 | Conklin |
| 2010/0111340 A1 | 5/2010 | Miller |
| 2013/0058506 A1 | 3/2013 | Boor |
| 2014/0097906 A1 | 4/2014 | Jennings |
| 2014/0112516 A1 | 4/2014 | Jiles |
| 2015/0117675 A1 | 4/2015 | Jennings |
| 2016/0044428 A1 | 2/2016 | Grossman |

FOREIGN PATENT DOCUMENTS

| | | |
|---|---|---|
| CN | 204291355 | 4/2015 |
| DE | 2346531 | 4/1975 |
| DE | 3406971 A | 8/1985 |
| DE | 3930009 A | 3/1991 |
| DE | 4444586 C | 2/1996 |
| EP | 0341902 A | 11/1989 |
| EP | 0984666 A2 | 8/2000 |
| EP | 1077587 A2 | 2/2001 |
| EP | 0984666 A3 | 9/2001 |
| EP | 1196008 A2 | 4/2002 |
| EP | 1398994 A2 | 3/2004 |
| EP | 1695592 B1 | 4/2011 |
| FR | 551182 | 3/1923 |
| FR | 564941 | 1/1924 |
| WO | 01/69964 A2 | 9/2001 |
| WO | 01/69967 A2 | 9/2001 |
| WO | 02/15636 A2 | 2/2002 |
| WO | 02/045461 A2 | 6/2002 |

OTHER PUBLICATIONS

Allen P.E., Holberg D.R., CMOS Analog Circuit Design, Oxford University Press, 1987, 14 pages.
Doyle, et al.; High Sensitivity, Low Power, Silicon Magnetic Field Detector; IEEE, Custom Integrated Circuits Conference; 1994.
International Search Report; Application No. PCT/US03/40130; Dec. 21, 2004.

* cited by examiner

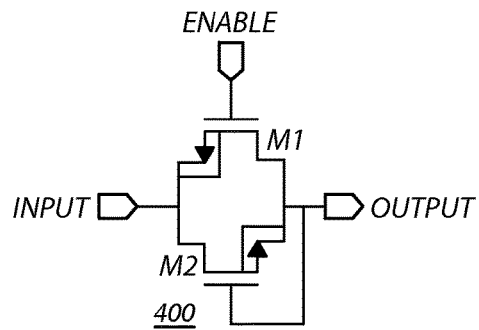
FIG. 4
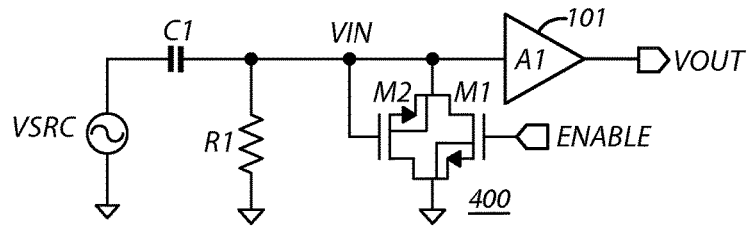
FIG. 5
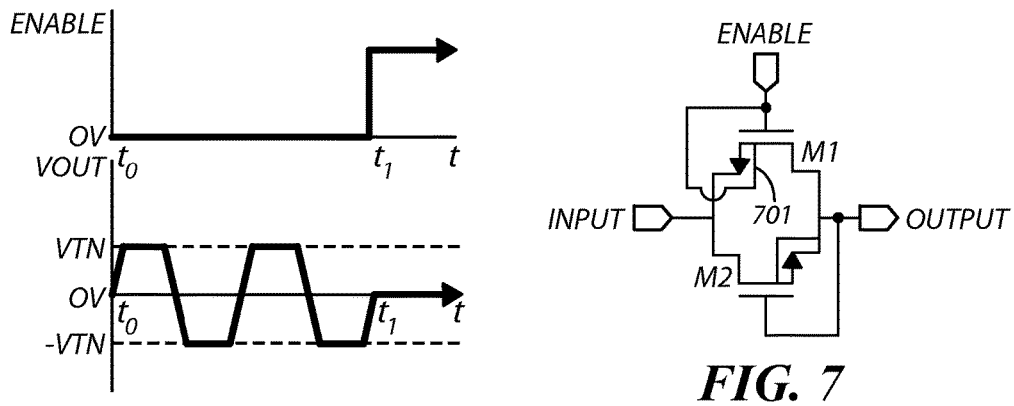
FIG. 6
FIG. 7

METHOD AND APPARATUS TO CLIP INCOMING SIGNALS IN OPPOSING DIRECTIONS WHEN IN AN OFF STATE

TECHNICAL FIELD

These teachings relate generally to electrical switches and more particularly to MOSFET active-disable switches.

BACKGROUND

Metal-oxide-semiconductor field-effect-transistors (MOSFET) are well known in the art and ubiquitous in integrated circuit design. In analog application settings such switches can transition from an on state to an off state or vice versa when operating with large signal amplitudes regardless of the specific desired state. As a result, MOSFET switches can impose an amplitude limit and clip signals.

Clipping gives rise in many cases to corresponding distortion. Accordingly, it will usually be preferred to avoid or otherwise prevent clipping altogether. Unfortunately, that result is not always possible. This means that in some application settings a certain amount of distortion is both anticipated and must, to at least some extent, be tolerated.

BRIEF DESCRIPTION OF THE DRAWINGS

The above needs are at least partially met through provision of the method and apparatus to clip incoming signals in opposing directions when in an off state described in the following detailed description, particularly when studied in conjunction with the drawings, wherein:

FIG. 4 comprises a schematic diagram as configured in accordance with various embodiments of these teachings;

FIG. 5 comprises a schematic diagram as configured in accordance with various embodiments of these teachings;

FIG. 6 comprises a graph as configured in accordance with various embodiments of these teachings; and FIG. 7 comprises a schematic diagram as configured in accordance with various embodiments of the invention.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present teachings. Also, common but well-understood elements that are useful or necessary in a commercially feasible embodiment are often not depicted in order to facilitate a less obstructed view of these various embodiments of the present teachings. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

DETAILED DESCRIPTION

Generally speaking, pursuant to these various embodiments a MOSFET active-disable switch is configured to clip an incoming signal in opposing directions when in an off state. By one approach the clipping is symmetrical and accordingly the switch clips both positive and negative peaks of the incoming signal in essentially equal ways. In many application settings it is useful for the clipping to serve to decrease a predetermined kind of resultant distortion such as even order distortion. In the on state this MOSFET active-disable switch is configured to not clip the incoming signal in opposing directions.

By clipping in both directions, and especially when that clipping is more or less symmetrical, the resultant clipped signal tends to yield a less-annoying distorted result. This result is owing, at least in part, to favoring odd order distortion over even order distortion. Accordingly, when circumstances of the application setting make avoiding clipping-based distortion difficult to achieve when using a MOSFET active-disable switch, these teachings make it possible to at least reduce the perceptible severity of that distortion.

Figure 1:
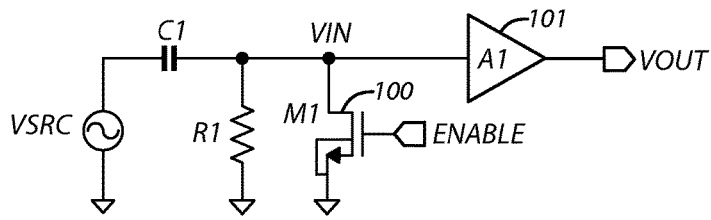
FIG. 1 comprises a schematic diagram as configured in accordance with the prior art.

These and other benefits may become clearer upon making a thorough review and study of the following detailed description. Before describing these teachings in further detail, however, it may be helpful to first briefly recount certain characterizing aspects regarding a typical prior art application setting in these regards. FIG. 1 illustrates an example of a basic prior art circuit that employs a MOSFET 100.

Figure 2:
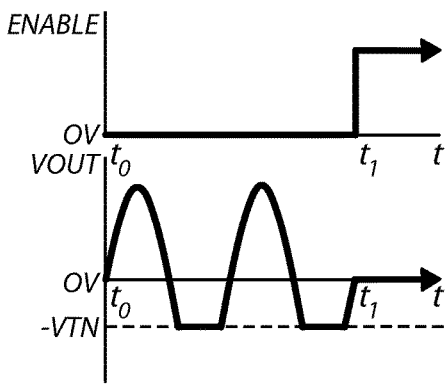
FIG. 2 comprises a graph as configured in accordance with the prior art.

More particularly, FIG. 1 depicts a MOSFET 100 comprising an NMOS device (though it will be well appreciated by those skilled in the art that a PMOS transistor could also serve in the same regards). In this circuit the gate of the MOSFET 100 couples to the ENABLE input for this active-disable switch. The drain of this MOSFET 100 connects to the input of an amplifier 101 and the source couples to ground. FIG. 2 depicts the behavior of this circuit with respect to the active-disable switch.

In particular, VSRC=VPK*sin(ωt) and VPK>VTN. In addition, VIN=VOUT since the amplifier 101 has unity gain in this example. ENABLE equals ground (i.e., in this example, 0V). As VIN increases from zero, the MOSFET 100 maintains a high impedance. As YIN decreases from zero and approaches −VTN, however, the drain of this MOSFET 100 behaves like a source and the MOSFET 100 will switch on. Switching on limits the minimum negative voltage at the output of the amplifier 101. Consequently, VOUT appears as a sine wave with the negative troughs clipped as shown. The resulting asymmetric waveform therefore contains significant even and odd order distortion.

The applicants have determined that, depending on the application, one type of distortion may be preferable to another type. For example, in audio applications, odd order distortion is often more tolerable to a human listener than even order in the presence of ultrasonic noise. Ultrasonic noise, of course, is relatively common, especially in an urban or populated setting. Ultrasonic signals are frequently used, for example, to sense moving persons in order to appropriately control automated doors and the like.

As one example in the foregoing regards, consider the following two-tone interim modulation distortion (IMD) test. If a 32 kHz tone and a 33 kHz tone are presented with amplitudes large enough to induce clipping, the second order IMD product will fall at 1 kHz which can be very audible. The third order IMD products, however, will fall at 31 kHz and 34 kHz, which are typically inaudible to most listeners.

With the foregoing in mind the teachings presented herein serve to provide symmetric clipping when such a switch is disabled to thereby encourage more favorable distortion characteristics and hence a more tolerable listening experience.

Figure 3:
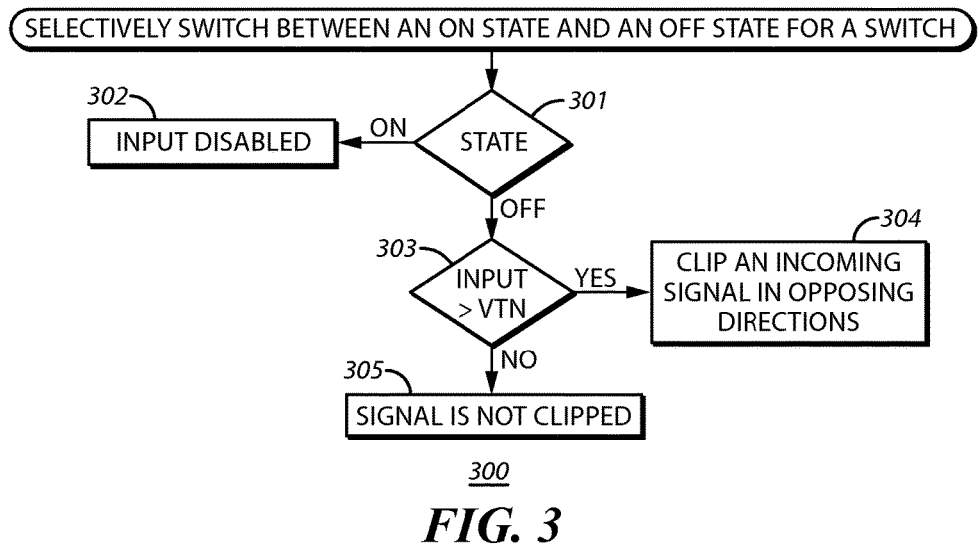
FIG. 3 comprises a flow diagram as configured in accordance with various embodiments of these teachings.

Referring now to the drawings, and in particular to FIG. 3, an illustrative process 300 that is compatible with many of these teachings will now be presented. Pursuant to one approach this process 300 applies when selectively switching between an on state and an off state for a switch and in particular a MOSFET-based active-disable switch.

In particular, at block 301 this process 300 provides for two different ways to respond to the on/off state of a MOSFET active-disable switch. When such a switch is on, at block 302 the input is disabled (hence the characterization "active-disable" to describe the disabled aspect of the switch when in an active on state). When such a switch is off, at block 303 this process 300 provides for responding in different ways depending upon whether the input is greater than VTN. When true, this process 300 provides for clipping an incoming signal in opposing directions (i.e., in both the positive and negative directions of the signal's amplitude) as indicated at block 304. In many application settings this clipping of the incoming signal in opposing directions can serve to symmetrically clip the incoming signal. When the input does not exceed VTN, and as indicated at block 305, the signal is not clipped.

Generally speaking, in a typical application setting this clipping of the incoming signal serves to at least decrease a predetermined kind of distortion (for example, in many cases, even order distortion). It is also possible that this clipping will also serve to increase, at least to some extent, an opposing kind of distortion (such as, for example, odd order distortion).

Accordingly, such an approach can ensure that large-amplitude signals that are going to be clipped in any event are clipped symmetrically.

FIG. 4 depicts a dual MOSFET active-disable switch that can serve in the foregoing regards. This switch includes two MOSFETs denoted here as M1 and M2. In this example these two MOSFETs M1 and M2 are nominally identical. In this illustrative example the source of the first MOSFET M1 connects to the drain of the second MOSFET M2 and comprises a signal input to the switch. The drain of the first MOSFET M1 connects to the source and gate of the second MOSFET M2 and comprises a signal output from the switch. The gate of the first MOSFET M1 constitutes an enable port for the switch.

It will be further noted in this illustrative embodiment that the body connection of the first MOSFET M1 connects to the source of the first MOSFET M1. These teachings will accommodate other approaches in these regards as described below.

It will be appreciated that, depending on how the NMOS component is fabricated, the foregoing connections as regards the source and drain of both MOSFETs could be reversed with no particular change in function or performance.

FIG. 5 depicts the use of such a switch 400 in the same circuit discussed above where the amplifier 101 again exhibits unity gain. FIG. 6 presents the behavior of this circuit when employing this switch 400. As before, VSRC=VPK*sin(ωt) and VPK>VTN. Because MOSFET M1 and MOSFET M2 are nominally identical, MOSFET M2 will limit YIN as the voltage attempts to exceed VTN. Now, in addition to clipping the bottom peaks, the top peaks are also clipped. As exemplified in FIG. 6, in this example the resultant wave form is substantially symmetrical and also approximates a 50% duty cycle that helps minimize even order distortion even further.

When ENABLE is asserted, the drain to source impedance of MOSFET M1 decreases and provides conduction across the switch 400. The on impedance can be further reduced by switching the body connection as shown in FIG. 7. In particular, in this example the body connection 701 for MOSFET M1, which would ordinarily connect to that transistor's source, connects instead to the ENABLE port. When the ENABLE port is asserted, voltage there is higher relative to its non-asserted value. Increasing the voltage applied to the body of MOSFET M1 will lower VTN. That, in turn, lowers the source-to-drain impedance when the switch 400 is on.

When the switch is off, ENABLE connects to the lowest bias voltage. All told, compared to the switch configuration shown in FIGS. 4 and 5, the switch shown in FIG. 7 provides lower impedance when the switch is on while exhibiting identical symmetrical clipping when off.

So configured, these teachings can help to at least ameliorate potentially unpleasant audible results under performance circumstances where distortion may not otherwise be avoidable. These teachings can be economically and efficiently utilized and hence the foregoing benefits are attainable at essentially little or no additional cost.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

What is claimed is:

1. An audio circuit comprising:
a dual metal-oxide-semiconductor field-effect transistor (MOSFET) active-disable switch having an audio signal input and an audio signal output,
the dual MOSFET active-disable switch comprising a first configuration where the dual MOSFET active-disable switch is in an ON state and a second configuration where the dual MOSFET active-disable switch is in an OFF state,
the dual MOSFET active-disable switch configured to decrease even order distortion by clipping an amplitude of an audio signal, applied to the audio signal input, in both positive and negative directions when the dual MOSFET active-disable switch is in the OFF state.

2. The audio circuit of claim 1, wherein the dual MOSFET active-disable switch is configured to symmetrically clip the audio signal when in the OFF state.

3. The audio circuit of claim 1, wherein the dual MOSFET active-disable switch is configured to not clip the audio signal in both the positive and negative directions when in the ON state.

4. The audio circuit of claim 1, wherein the dual MOSFET active-disable switch includes a first MOSFET having a source, drain, and gate and a second MOSFET having a source, drain, and gate, wherein:
the source of the first MOSFET and the drain of the second MOSFET are connected and comprise the audio signal input of the dual MOSFET active-disable switch,
the drain of the first MOSFET and the source and the gate of the second MOSFET are connected and comprise the audio signal output of the dual MOSFET active-disable switch,
the gate of the first MOSFET constitutes an enable port for the dual MOSFET active-disable switch, and the gate of the second MOSFET is connected to the audio signal output of the dual MOSFET active-disable switch.

5. The audio circuit of claim 4, wherein a body connection of the first MOSFET is connected to the source of the first MOSFET.

6. The audio circuit of claim 4, wherein a body connection of the first MOSFET is connected to the gate of the first MOSFET.

7. A method in an audio circuit, the method comprising:
receiving an audio signal at an input to a dual metal-oxide-semiconductor field-effect transistor (MOSFET) active-disable switch;
selectively switching the dual MOSFET active-disable switch between an ON state and an OFF state;
decreasing even order distortion by clipping an amplitude of the audio signal in both positive and negative directions when the dual MOSFET active-disable switch is in the OFF state.

8. The method of claim 7, further comprising clipping the audio signal in both the positive and negative directions symmetrically.

9. The method of claim 7, further comprising not clipping the audio signal in both the positive and negative directions when the dual MOSFET active disable switch is in the ON state.

10. The method of claim 7, wherein the dual MOSFET active-disable switch includes a first MOSFET having a source, drain, and gate and a second MOSFET having a source, drain, and gate, the source of the first MOSFET and the drain of the second MOSFET are connected and comprise the input of the dual MOSFET active-disable switch the drain of the first MOSFET and the source and the gate of the second MOSFET are connected and comprise an output of the dual MOSFET active-disable switch and the gate of the first MOSFET constitutes an enable port for the dual MOSFET active-disable switch, selectively switching the dual MOSFET active-disable switch by applying a signal to the enable port.

11. The method of claim 10, wherein a body connection of the first MOSFET is connected to the source of the first MOSFET.

12. The method of claim 10, wherein a body connection of the first MOSFET is connected to the gate of the first MOSFET.

13. The audio circuit of claim 3, wherein the dual MOSFET active-disable switch is configured to symmetrically clip the audio signal when in the OFF state.

14. The audio circuit of claim 13, further comprising an audio amplifier coupled to the audio output of the dual MOSFET active-disable switch.

15. The method of claim 7, further comprising amplifying the audio signal after decreasing even order distortion.

16. An audio circuit comprising:
a dual metal-oxide-semiconductor field-effect transistor (MOSFET) active-disable switch having an audio signal input and an audio signal output configured to clip an incoming signal, applied to the audio signal input, in opposing directions when the dual MOSFET active-disable switch is in an OFF state,
the dual MOSFET active-disable switch including a first MOSFET having a source, drain, and gate and a second MOSFET having a source, drain, and gate, wherein:
the source of the first MOSFET and the drain of the second MOSFET are connected and comprise the audio signal input of the dual MOSFET active-disable switch,
the drain of the first MOSFET and the source and the gate of the second MOSFET are connected and comprise the audio signal output of the dual MOSFET active-disable switch,
the gate of the first MOSFET constitutes an enable port for the dual MOSFET active-disable switch, and
the gate of the second MOSFET is connected to the audio signal output of the dual MOSFET active-disable switch.

* * * * *